(12) United States Patent
Anumula et al.

(10) Patent No.: US 6,630,860 B1
(45) Date of Patent: Oct. 7, 2003

(54) PROGRAMMABLE PHASE LOCKED-LOOP FILTER ARCHITECTURE FOR A RANGE SELECTABLE BANDWIDTH

(75) Inventors: Sudhaker Reddy Anumula, San Diego, CA (US); Thomas Clark Bryan, Encinitas, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 09/666,353

(22) Filed: Sep. 20, 2000

(51) Int. Cl.[7] .............................................. H03K 5/00
(52) U.S. Cl. ...................................... 327/553; 327/308
(58) Field of Search ................................ 327/552, 553, 327/554, 94, 337, 344, 159, 308

(56) References Cited

U.S. PATENT DOCUMENTS

| | | | | |
|---|---|---|---|---|
| 4,733,205 A | * | 3/1988 | Hughes ........................ 333/172 |
| 4,785,253 A | | 11/1988 | Hughes ........................ 328/167 |
| 4,857,778 A | | 8/1989 | Hague ......................... 307/521 |
| 5,113,116 A | * | 5/1992 | Wilson ........................ 310/116 |
| 5,272,452 A | * | 12/1993 | Adachi et al. ................. 331/17 |
| 5,278,478 A | * | 1/1994 | Moody et al. ................. 318/560 |
| 5,317,217 A | | 5/1994 | Rieger et al. ................. 307/521 |
| 5,331,218 A | | 7/1994 | Moody et al. ................. 307/521 |
| 5,345,119 A | * | 9/1994 | Khoury ........................ 327/553 |
| 5,392,456 A | | 2/1995 | Mitomo et al. ............... 455/38.3 |
| 6,072,360 A | | 6/2000 | McCullough ................. 327/558 |
| 6,366,161 B1 | * | 4/2002 | Koazechi ..................... 327/553 |

* cited by examiner

Primary Examiner—Dinh T. Le
(74) Attorney, Agent, or Firm—Incaplaw; Terrance A. Meador

(57) ABSTRACT

A programmable phase locked-loop (PLL) active filter circuit is provided which includes networks of cooperating bandwidth tuning components to select bandwidth ranges. The values and arrangement of the network of selectable series input (R1) resistors are chosen to be useful in both low band and high band settings. Likewise, the opamp network of feedback resistors (R2) and capacitors (C1) values are chosen to be useful in both low band and high band applications, automatically pairing with the R1 selection in response to a bandwidth range selection. These tuning components, internal to an integrated circuit, can be used for a plurality of wideband loops. External components can be used to supplement the internal components for low and high bandwidth applications.

13 Claims, 7 Drawing Sheets

PROGRAMMABLE PHASE LOCKED-LOOP FILTER ARCHITECTURE FOR A RANGE SELECTABLE BANDWIDTH

BACKGROUND OF THE INVENTION

1. Field of the Invention

The invention relates generally to integrated circuit (IC) active loop filter circuitry and, more particularly, to a filter network that can be programmed to operate over multiple bandwidth ranges in a phase locked-loop system.

2. Description of the Related Art

Phase locked loop circuits, including active filters, are used in communication systems and also as part of larger digital system applications such as clock de-skewing, clock synchronization, high speed serial transmission, and clock recovery. The challenges of the complicated larger systems configured from integrated circuits include variable supply noise frequency spurs (system dependent), variable bandwidth requirements (system application dependent), and reliable operation of the phase locked-loop systems under the stringent requirements. Thus, the challenge is to design a phase-locked loop (PLL) that is configured to satisfy the application dependent bandwidth requirements, as well as variable power supply noise frequency requirements.

FIG. 1 is a schematic block diagram illustrating a generic PLL circuit 10 using an active filter architecture (prior art). An active filter 12 is a key component of the loop. The bandwidth (BW) of the PLL is given by the following equation:

$$PLL\ BW = (K_{PD}/2\pi) * (K_V/N) * (R2/R1) * A$$

$$\text{loop damping} = 0.5 * (sqrt\{K_{PD} ** (K_V/N) * A * (R2^2 * C)/R1\}$$

where $K_{PD}$ and $K_V$ are phase detector and VCO gain parameters, respectively. A is the external attenuation factor of the PLL. Typically, A=1 for on-chip PLL implementations. R1, R2, and C are components of the active filter 12.

FIG. 2 is a schematic diagram illustrating the active filter 12 of the PLL of FIG. 1 (prior art). The bandwidth and stability parameters of the PLL are determined by the values of R1 (16), R2 (18), C (20), and attenuation factor A, which is defined by the ratio of R4 (24) to R3 (22). For discrete integrated circuit applications, these tuning components have been conventionally located external to the IC, on the printed circuit board (PCB). However, these components take up PCB real estate and their exposure can lead to the injection of noise at critical circuit nodes, which degrades performance. Prior art on-chip integrated circuit PLL circuits are also known. However, due to the limited range of IC internal tuning components, a corresponding limited range of PLL bandwidths are available. Other schemes use multiplexor (MUX) circuits to provide a great range of tuning components, but the multiplexor circuit connections are necessarily numerous, permitting the injection of noise into the more sensitive nodes of the PLL system. Other designs provide PLL bandwidth ranges by providing an IC with parallel tuning circuits. The limited number of node connections in the chosen circuit reduces the noise injection problem, but space and power consumption on the IC is wasted.

Parallel circuits of duplicate parts are required, where each parallel circuit contains its own amplifier, tuning components, and oscillator.

It would be advantageous if an IC could be devised for configuring PLL bandwidth ranges with the minimum number of internal IC components. Likewise, it would desirable if the bandwidth ranges could be selected with the minimum number of instructions, such as with a user programmable configuration register.

It would be advantageous if the above-mentioned bandwidth range selectable IC could be devised to optionally operate with external components to provide configurable bandwidth ranges.

SUMMARY OF THE INVENTION

Accordingly, a programmable active filter architecture is provided for IC designs such as phase-locked loop systems. The invention represents a significant improvement over conventional active filter implementations in terms of the flexibility offered in the selection of the desired range (low or high) bandwidth and desired filter mode (external or internal implementation). The bandwidth ranges are available without having to implement a system of different selectable loops. The invention describes the circuit implementation details of the active filter components, loop stability considerations, programmable features for selecting the bandwidth range (low or high) and filter mode (external or internal).

More specifically, a PLL active filter integrated circuit with selectable bandwidth ranges is provided. The PLL active filter comprises an amplifier and a filter network. The filter network is coupled to the amplifier and supplies a plurality of PLL bandwidth ranges in response to the bandwidth range commands.

For example, when the filter network accepts an external mode, low bandwidth range command, the filter network supplies a large value of R1 resistance, a small value of R2 resistance, and a large C1 capacitance in parallel to the R2 resistance. An external capacitor can also be selectively connected between the filter network and the amplifier output for improved damping. When the filter network accepts an external mode, high bandwidth command, the filter network supplies a low value of R1 resistance, a large value of R2 resistance, and a small C1 capacitance in parallel to the R2 resistance. Again, the external capacitor can be selectively added to the filter to modify the damping factor. The filter network also has an internal mode, high bandwidth range command. Actually, there are a plurality of internal mode, high bandwidth range commands, where each specific command corresponds to a selected value of R1 resistance. The internal mode, high bandwidth range commands also select a (fixed) low value of R2 resistance and a (fixed) large value of C1 capacitance in parallel to the R2 resistance.

DETAILED DESCRIPTION OF THE PREFERRED EMBODIMENTS

Figure 1:
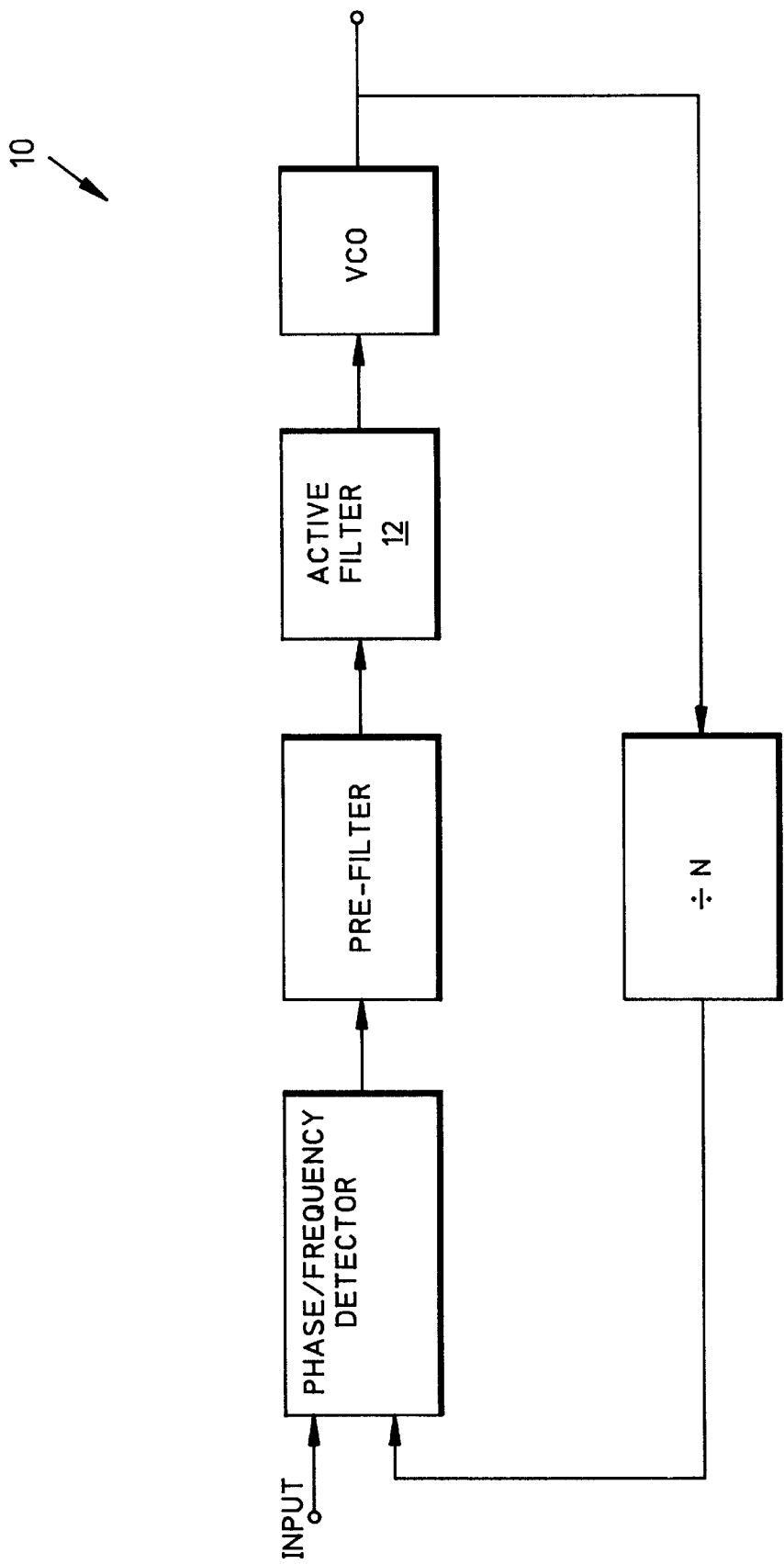
FIG. 1 is a schematic block diagram illustrating a generic PLL circuit using an active filter architecture (prior art).
Figure 2:
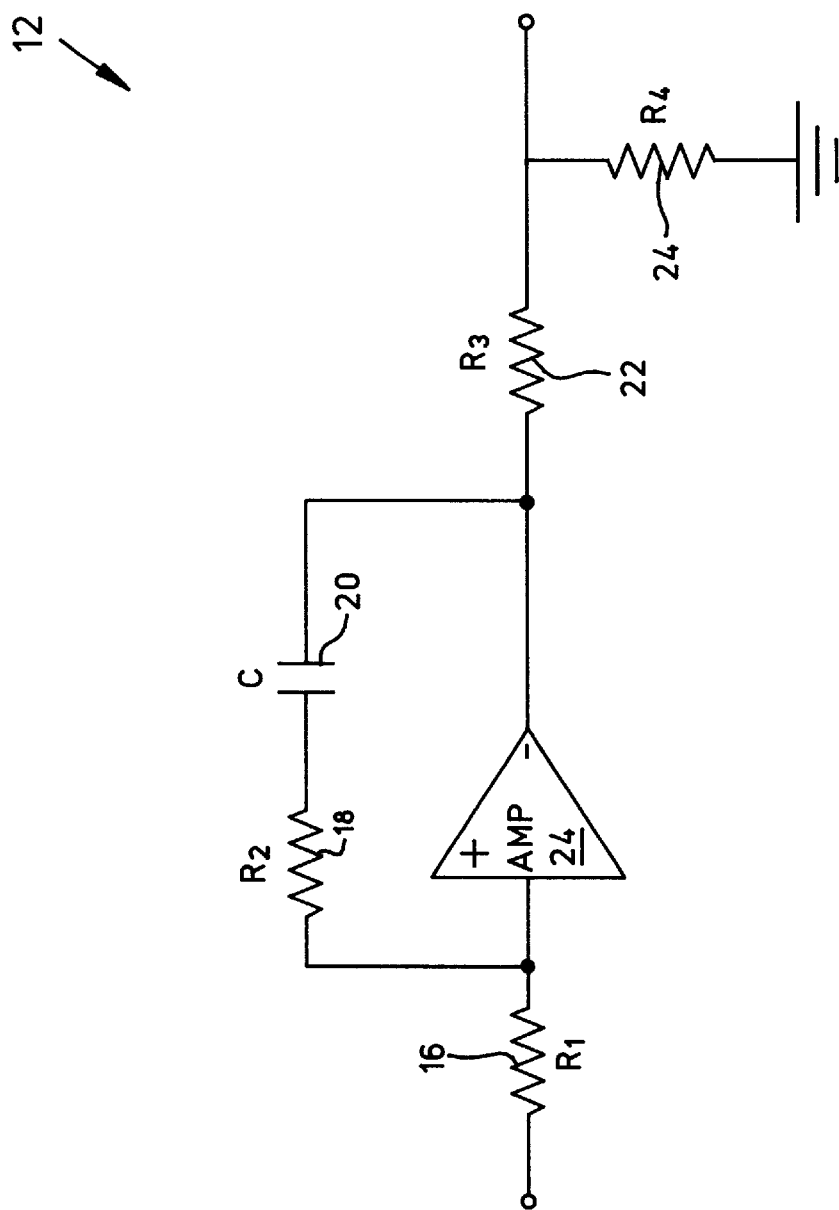
FIG. 2 is a schematic diagram illustrating the active filter of the PLL of FIG. 1 (prior art).
Figure 3:
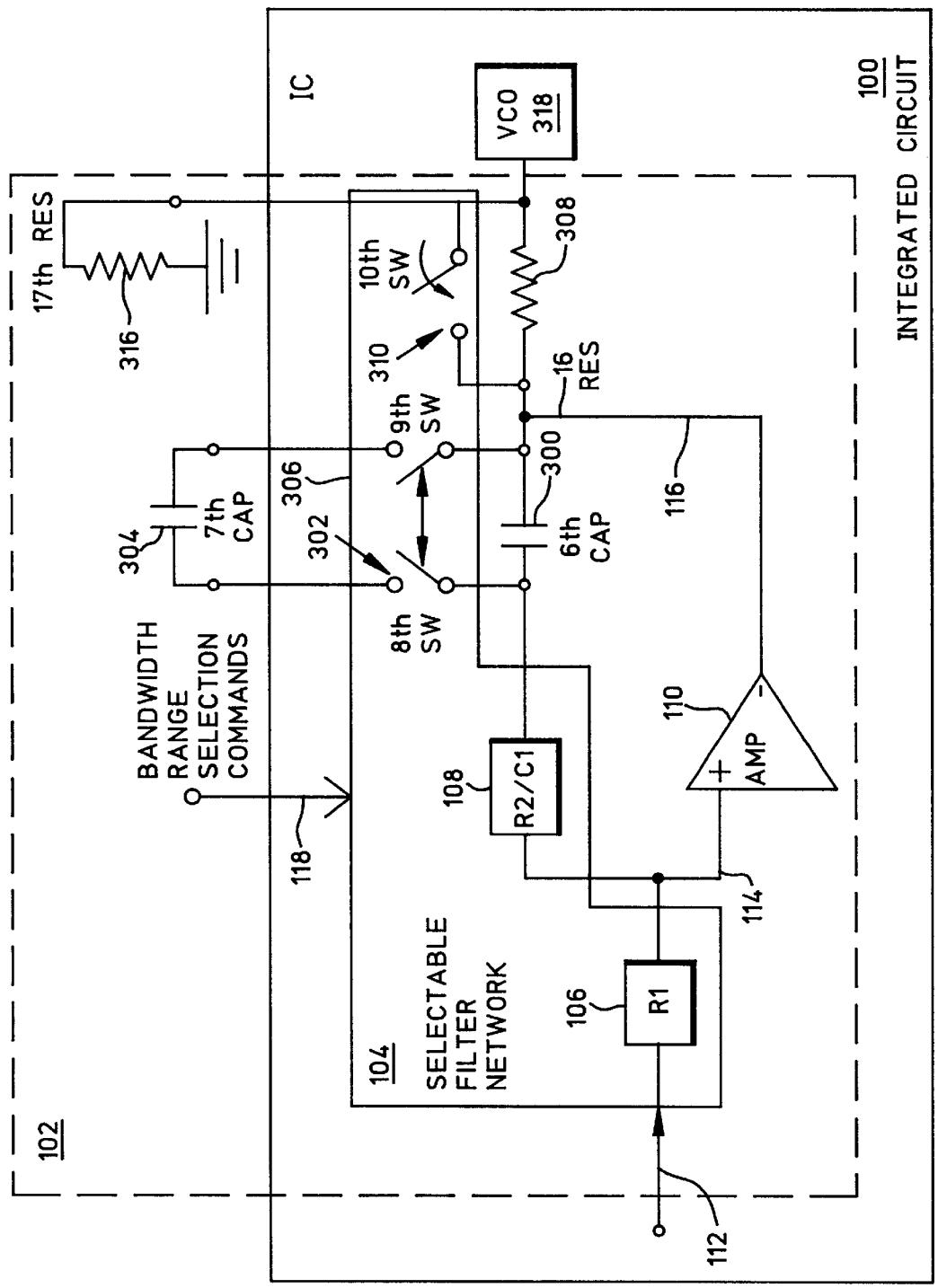
FIG. 3 is a schematic block diagram illustrating the present invention integrated circuit PLL including an active filter with programmable bandwidth ranges.

FIG. 3 is a schematic block diagram illustrating the present invention integrated circuit PLL 100 including an active filter 102 with programmable bandwidth ranges. Generally, the invention describes the circuit implementation details of the active filter components, loop stability considerations, programmable features for selecting the bandwidth range (low or high) and filter mode (external or internal). Specifically, the invention describes a programmable filter network 104 that includes a selectable R1 resistance 106 that is a network of resistors and switches, and a selectable parallel R2/C1 network 108 that is a network of resistors, capacitors in parallel with the resistors, and switches. Unlike multiplexor networks however, the resistor and capacitor values are chosen for cooperation between networks 106 and 108. That is, the networks 106/108 are commanded to work in one of three pre-configured arrangement of components. As explained in detail below, the filter network 104 can be used in conjunction with external resistors and capacitors to extend the bandwidth range selection.

The active filter 102 comprises a single-ended amplifier 110 having an input and an output. The filter network 104 has a first port on lo line 112 to accept an input signal, a second port connected to the amplifier input on line 114, a third port coupled to the amplifier output on line 116, and a fourth port to accept bandwidth range commands on line 118. The filter network 102 supplies a plurality of PLL bandwidth ranges in response to the bandwidth range commands. As noted above, the selectable R1 resistance 106 and selectable parallel R2/C1 network cooperate by automatically configuring themselves into one of three basic bandwidth ranges in response to the bandwidth range commands on line 118. The bandwidth range commands are typically provided from a user configurable register.

More specifically, when the filter network 102 accepts an external mode, low bandwidth range command, a large value of R1 resistance is supplied between the first and second ports on lines 112 and 114, respectively. Simultaneously, a small value of R2 resistance is supplied between the second port on line 114 and the third port coupled to line 116, and a large C1 capacitance is supplied in parallel to the R2 resistance. Details of the selectable R1 resistor 106 and selectable R2/C1 network 108 are provided below.

When the filter network 102 accepts an external mode, high bandwidth range command, a low value of R1 resistance is supplied between the first and second ports on lines 112 and 114, respectively. Simultaneously, a large value of R2 resistance is supplied between the second port on line 114 and the third port coupled to line 116, and a small C1 capacitance is supplied in parallel to the R2 resistance.

The filter network 102 accepts a plurality of internal mode, high bandwidth range commands. In response to the plurality of internal, high bandwidth range commands a corresponding plurality of R1 resistances are supplied between the first and second ports on lines 112 and 114, respectively. Simultaneously, a low (fixed) value of R2 resistance is supplied between the second port on line 114 and the third port coupled to line 116, and a large (fixed) value of C1 capacitance is supplied in parallel to the R2 resistance. Since no external components are selected in this mode of operation, optimal noise performance is obtained.

Figure 4:
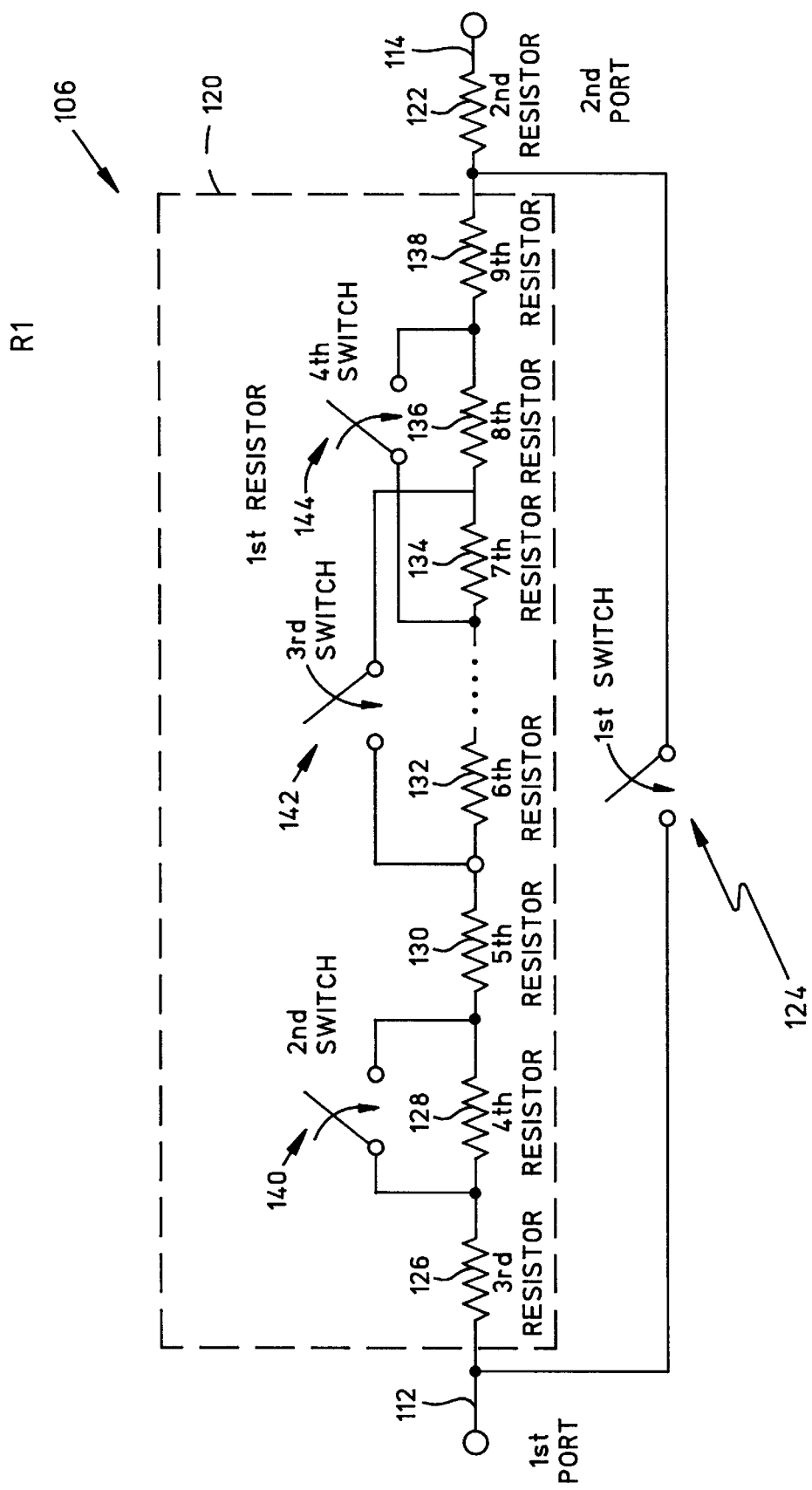
FIG. 4 is a schematic diagram of the selectable R1 resistor of FIG. 3.

FIG. 4 is a schematic diagram of the selectable R1 resistor 106 of FIG. 3. The selectable R1 resistor 106 includes a first resistor 120, shown surrounded by dotted lines, with a plurality of selectable series resistors. The first resistor 120 has an input connected to the first port of the filter network on line 112, and the first resistor 120 has an output. A second resistor 122 has an input connected to the output of the first resistor 120 and an output connected to the second port of the filter network on line 114. A first switch 124 has an input connected to the first port of the filter network on line 112 and an output connected to the output of the first resistor 120. In one aspect of the invention, the first switch 124, and the switches introduced below, are implemented with P-channel and N-channel transistors with differential select signals.

The first resistor 120 includes a third resistor 126 having an input connected to the input of first switch 124 and an output. A fourth resistor 128 has an input connected to the output of the third resistor 126 and the fourth resistor 128 has an output. A fifth resistor 130 has an input connected to the output of the fourth resistor 128 and the fifth resistor 130 has an output. A sixth resistor 132 has an input connected to the output of the fifth resistor 130 and the sixth resistor 132 has an output. A seventh resistor 134 has an input connected to the output of the sixth resistor 132 and the seventh resistor 134 has an output. An eighth resistor 136 has an input connected to the output of the seventh resistor 134 and the eighth resistor 136 has an output. A ninth resistor 138 has an input connected to the output of the eighth resistor 136 and the ninth resistor 138 has an output connected to the input of the second resistor 122.

A second switch 140 has an input connected to the input of the fourth resistor 128 and an output connected to the output of the fourth resistor 128. A third switch 142 has an input connected to input of the sixth resistor 132 and an output connected to the output of the seventh resistor 134. A fourth switch 144 has an input connected to input of the seventh resistor 134 and an output connected-to the output of the eighth resistor 136.

A dotted line is shown connecting sixth resistor 132 and seventh resistor 134. The dotted line is intended to represent that additional resistors could be added between the sixth resistor 132 and the seventh resistor 134 in other aspects of the invention. Likewise, additional switches could be added to connect these additional resistors (not shown) to create further R1 resistance combinations.

The network has the three fundamental select modes. When the filter network receives an external mode, low bandwidth range command, it is desirable to have a large value of R1 resistance. Therefore, the first switch 124 is opened. Likewise, the second, third, and fourth switches 140/142/144 are opened. When the external mode, high bandwidth range command is received on line 118 (see FIG. 3), a lower value of R1 is required. Therefore, the first switch 124 is closed, and the R1 value is approximately equal to the resistance of the second resistor 122 and the resistance across the first switch 124.

The internal mode, high bandwidth range command is actually a plurality of commands which selectively control the operation of the first switch 124, second switch 140, third switch 142, and fourth switch 144. The first switch 124 is open in all cases. Combining the opening and closing of the second, third, and fourth switches 140/142/144 creates a plurality of R1 resistances corresponding to the number of internal mode, high bandwidth range commands.

Figure 5:
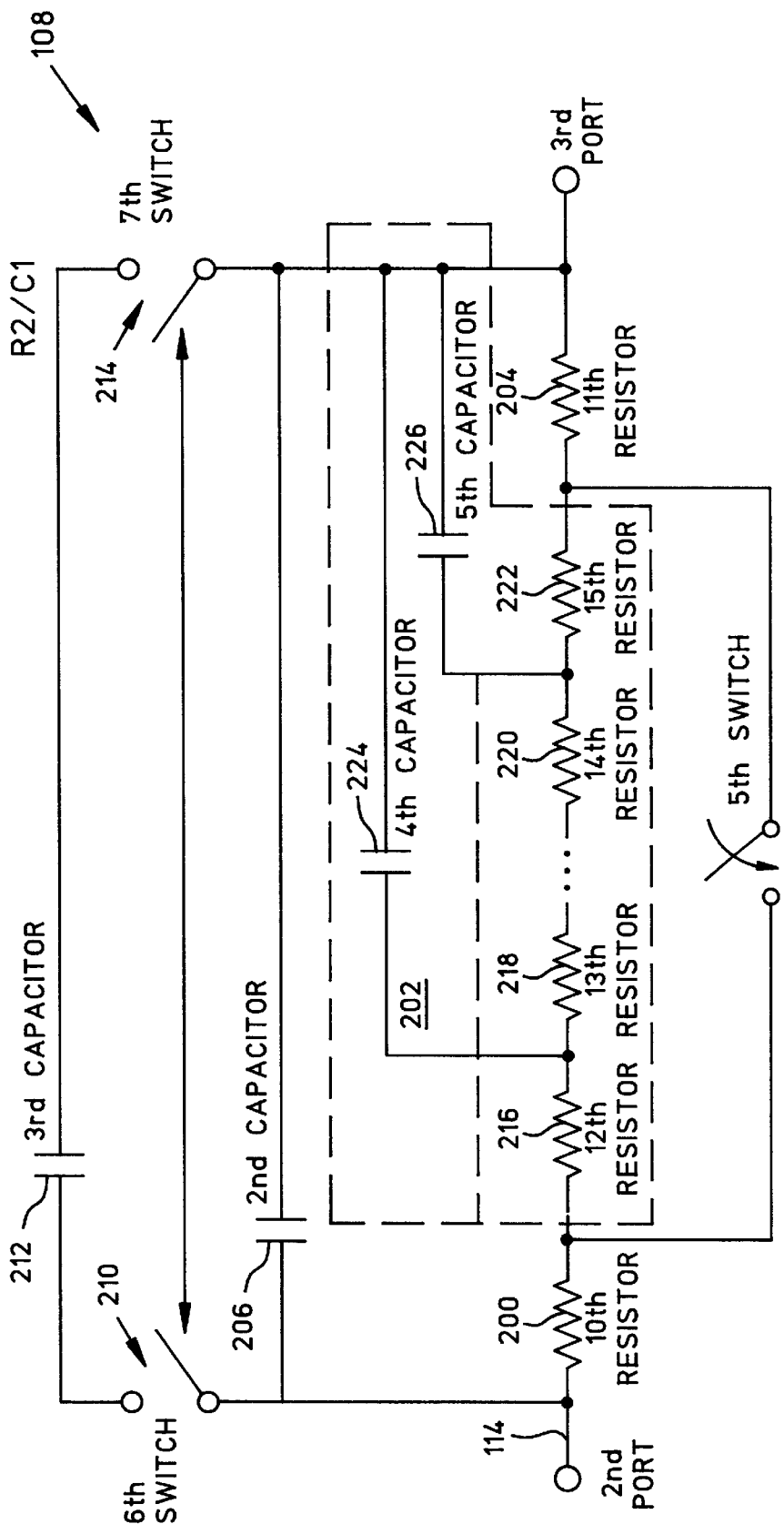
FIG. 5 is a schematic diagram illustrating the selectable parallel R2 resistance/C1 capacitance network of FIG. 3.

FIG. 5 is a schematic diagram illustrating the selectable parallel R2 resistance/C1 capacitance network 108 of FIG. 3. The selectable parallel R2 resistance/C1 capacitance network 108 includes a tenth resistor 200 having an input connected to the second port of the selectable filter network on line 114 and an output. A multi-pole network 202 has an input connected to output of the tenth resistor 200 and an output. An eleventh resistor 204 has an input connected to the output of the multi-pole network 202 and an output connected to the third port of the filter network.

A second capacitor 206 has an input connected to the second port of the filter network on line 114 and an output connected to the third port of the filter network. A fifth switch 208 has an input connected to the output of the tenth resistor 200 and an output connected to the output of the multi-pole network 202.

A sixth switch 210 has an input connected to the second port of the filter network on line 114 and an output. A third capacitor 212 has an input connected to the output of the sixth switch 210 and an output. A seventh switch 214 has an input connected to the output of the third capacitor 212 and an output connected to the third port of the filter network.

The multi-pole network 202 includes a twelfth resistor 216 having an input connected to the output of the tenth resistor 200 and an output. A thirteenth resistor 218 has an input connected to the output of the twelfth resistor 216 and an output. A fourteenth resistor 220 has an input connected to the output of the thirteenth resistor 218 and an output. A fifteenth resistor 222 has an input connected to the output of the fourteenth resistor 220 and an output connected to the input of the eleventh resistor 204. A fourth capacitor 224 has an input connected to the input of the thirteenth resistor 218 and an output connected to the third port of the filter network. A fifth capacitor 226 has an input connected to the input of the fifteenth resistor 222 and an output connected to the third port of the filter network.

When the filter network accepts an external mode, low bandwidth range command at the fourth port, the fifth switch 208 is closed to minimize the R2 resistance. Note, the resistance of the fifth switch 208 is small relative to the resistance of the tenth resistor 200 and the eleventh resistor 204. The sixth switch 210 and the seventh switch 214 are closed to maximize the C1 capacitance. The addition of a large C1 capacitance insures closed loop stability of the amplifier 110. The total resistance is the result of the tenth resistor 200, the eleventh resistor 204, and the resistance of the fifth switch 208. The total capacitance is the result of the second capacitor 206 and the third capacitor 212, which has significantly more capacitance than the second capacitor 206. This allows independent control of the opamp 110 closed-loop compensation in the external mode, low bandwidth range mode without interfering with the high bandwidth range mode phase-locked loop system stability. The value of the third capacitor 212 is optimized with the worst-case closed loop opamp 110 stability considerations.

When the filter network accepts an external mode, high bandwidth range command at the fourth port, the fifth switch 208 is opened to maximize the R2 resistance. The sixth switch 210 and the seventh switch 214 are opened for the reduction of the C1 capacitance needed to insure amplifier 110 closed loop stability. For PLL closed loop stability, a series of relatively high frequency poles are created, optimally placed as explained below. One high frequency pole is created with the cooperation of second capacitor 206 with the combined resistance value of the tenth resistor 200, the twelfth resistor 216, the thirteenth resistor 218, the fourteenth resistor 220, the fifteenth resistor 222, and the eleventh resistor 204. A second high frequency pole is created by the cooperation of fourth capacitor 224 and the combined resistance of the thirteenth resistor 218, the fourteenth resistor 220, the fifteenth resistor 222, and the eleventh resistor 204. A third high frequency pole is created by the cooperation of the fifth capacitor 226 and the combined resistance of the fifteenth resistor 222 and the eleventh resistor 204. The optimum placement for the capacitors is dictated by the highest bandwidth range target and the worst-case PLL phase margin considerations. The high frequency poles for the PLL are generally intended to improve the stability of the amplifier 110 in the closed loop, and do not interfere with the PLL stability. The dotted lines shown connecting the thirteenth resistor 218 and the fourteenth resistor 220 are intended to represent the potential for the addition of resistors and capacitors, to place additional high frequency poles.

When the filter network also accepts internal mode, high bandwidth range commands at the fourth port, the fifth switch 208, the sixth switch 210, and seventh switch 214 are closed to minimize the R2 resistance but maximize the C1 capacitance. The compensation scheme utilized for the external mode, low bandwidth range works for this mode with the same of value of R2 and the programmable R1 configuration described above.

Returning to FIG. 3, a sixth capacitor 300 is included having an input connected to the third port of the filter network and an output connected to the amplifier output on line 116. In addition, an eighth switch 302 has an input connected to the third port of the filter network and an output connected to an external IC port. A seventh capacitor 304, external to the integrated circuit 100, has an input connected to the output of the eighth switch 302 and an output. A ninth switch 306 has an input connected to an external IC port to interface with the output of the sixth capacitor 304. The ninth switch 306 has output connected to the output of the amplifier on line 116. The eighth switch 302 and the ninth switch 306 are closed in response to the external mode, low bandwidth range command to control the damping factor. Likewise, the eighth switch 302 and the ninth switch 306 are closed in response to the external mode, high bandwidth range command to improve and control the damping factor.

A sixteenth resistor 308 is included in some aspects of the invention, having an input connected to the amplifier output on line 116 and an output. A tenth switch 310 has an input connected to the output of the amplifier on line 116 and an output connected to the output of the sixteenth resistor 308. The tenth switch is opened, to include the sixteenth resistor 308, in response to external mode, low bandwidth range and external mode, high bandwidth range commands. Together, the sixteenth resistor 308 and an optionally connected seventeenth resistor 316, external to the IC 100, form an attenuation network. Because seventeenth resistor 316 is an external component, bandwidths can be targeted in the range from tenths of kHz to hundreds of kHz in the external mode, low bandwidth range. Likewise, when the external mode, high bandwidth range command is given, the seventeenth resistor 316 is used. The tenth switch 310 is opened, and sixteenth resistor 308 and seventeenth resistor 316 form an attenuation network. Bandwidths in the range from MHz onwards to tens of MHz are possible in this configuration.

In some aspects of the invention when an internal mode, high bandwidth command is used, the tenth switch 310 is closed to bypass the sixteenth resistor 308. In these circumstances the seventeenth resistor is typically not used. The attenuation network formed by the sixteenth resistor 308 and the seventeenth resistor 316, connected between the amplifier 110 output and an input to a voltage controlled oscillator 318, is bypassed. That is, the external attenuation factor A is equal to one.

Figure 6:
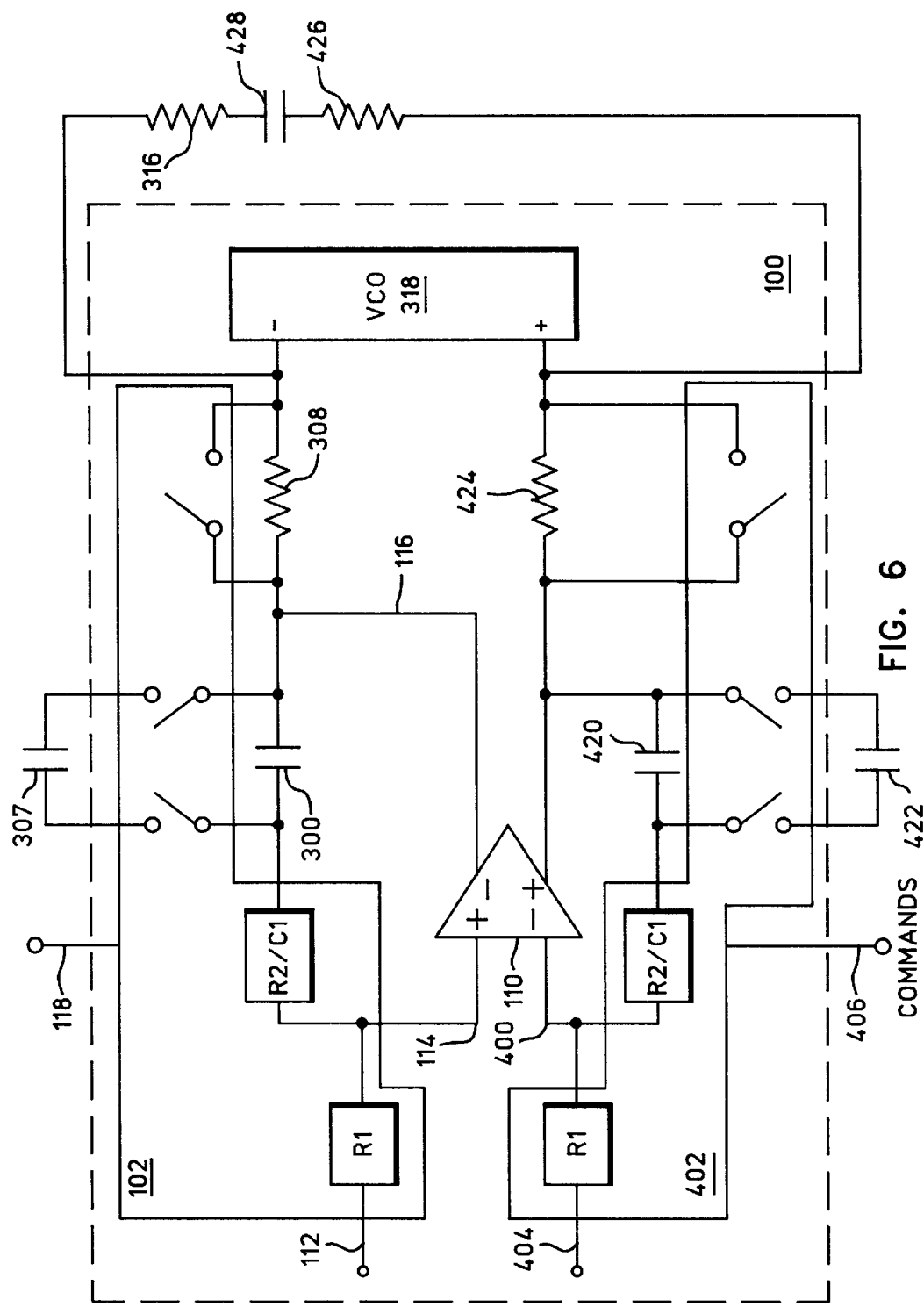
FIG. 6 is a schematic diagram of the present invention selectable PLL bandwidth range active filter using a differential signal amplifier and a VCO.

FIG. 6 is a schematic diagram of the present invention selectable PLL bandwidth range active filter using a differential signal amplifier 110 and the VCO 318. The amplifier 110 has a positive input connected to the second port of a first filter network 102 on line 114. The amplifier 110 further includes a negative input connected to line 400. A second filter network 402 is included having a first port on line 404 to accept an input signal, a second port connected to the amplifier negative input on line 400, a third port, and a fourth port on line 406 to accept bandwidth range commands. As with the first filter network 102 described above, the second filter network 402 supplies a plurality of active filter bandwidth ranges in response to the bandwidth range commands. The first and second filter networks 102/402 provide equivalent resistance and capacitance values simultaneously. Capacitor 420 corresponds to sixth capacitor 300. Capacitor 422 corresponds to seventh capacitor 304. Resistor 424 corresponds to sixteenth resistor 308, resistor 426 corresponds to seventeenth resistor 316, and capacitor 428 provides an AC ground.

Figure 7:
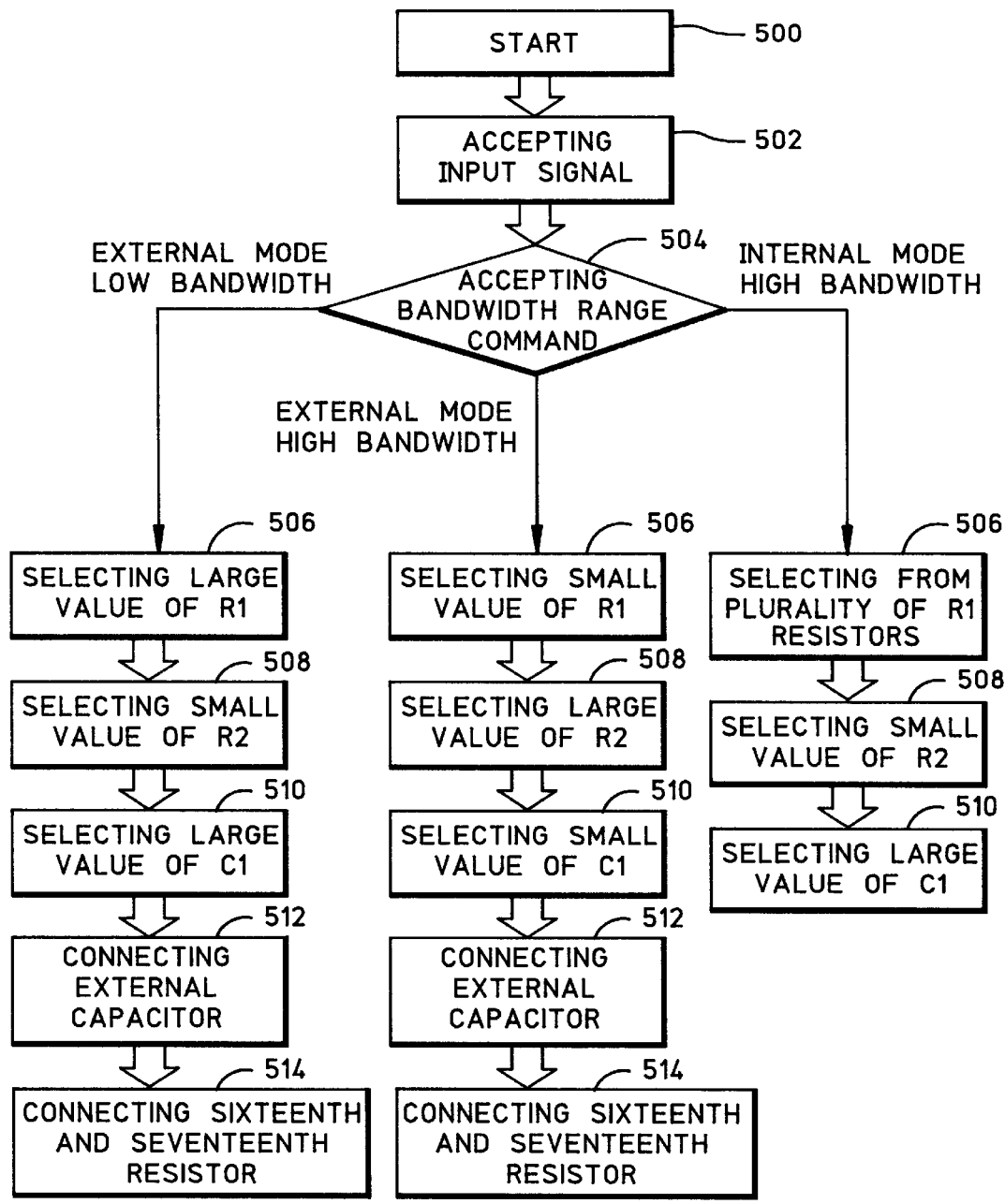
FIG. 7 is a flowchart illustrating the present invention method for varying the bandwidth range of an integrated circuit (IC) phase locked-loop (PLL) active filter including a filter network and an amplifier.

FIG. 7 is a flowchart illustrating the present invention method for varying the bandwidth range of an integrated circuit (IC) PLL active filter including a filter network and an amplifier. Although the method is depicted as a sequence of numbered steps for clarity, no order should be inferred from the numbering unless explicitly stated. The method begins at Step 500. Step 502 accepts an input signal. Step 504 accepts a bandwidth range command. Step 506, in response to the bandwidth range command, selects the value of the R1 resistance in series to the amplifier input. Step 508 selects the value of R2 resistance from the amplifier output to the amplifier input in cooperation with the R1 resistance selected in Step 506. Step 510 selects the value C1 capacitance in parallel with the R2 resistance, in cooperation with the R1 resistance selected in Step 506 and the R2 resistance selected in Step 508.

In some aspects of the invention, accepting a bandwidth range command in Step 504 includes accepting an external mode, low bandwidth range command. Then, selecting an R1 resistance in Step 506 includes selecting a large value of the R1 resistance in series to the amplifier input. Selecting an R2 resistance in Step 508 includes selecting a small value of R2 resistance from the amplifier output to the amplifier input. Selecting a C1 capacitance in Step 510 includes selecting a large value C1 capacitance in parallel with the R2 resistance.

In some aspects of the invention an internal sixth capacitor connects the R2 resistor and the amplifier output, and an external seventh capacitor (see FIG. 3) is included. A further step, Step 512 connects the external capacitor between the R2 resistance and the amplifier output in response to the external mode, low bandwidth range command in Step 504.

In some aspects of the invention, a voltage controlled oscillator (VCO) is included, as well as an external seventeenth resistor having an input connected to the input of the VCO and an output connected to ground. Then, Step 514 connects a sixteenth resistor between the amplifier output and the input of the seventeenth resistor. The sixteenth and seventeenth resistors form an attenuation network between the amplifier output and the VCO input.

In some aspects of.the invention, accepting a bandwidth range command in Step 504 includes accepting an external mode, high bandwidth range command. Then, selecting an R1 resistance in Step 506 includes selecting a small value of the R1 resistance in series to the amplifier input. Selecting an R2 resistance in Step 508 includes selecting a large value of R2 resistance from the amplifier output to the amplifier input. Selecting a C1 capacitance in Step 510 includes selecting a small value C1 capacitance in parallel with the R2 resistance.

Step 512 connects the external capacitor between the R2 resistance and the amplifier output in response to the external mode, high bandwidth range commands in Step 504, and Step 514 connects the sixteenth resistor value from the amplifier output to the seventeenth resistor and the VCO inputs.

In some aspects of the invention, accepting a bandwidth range command in Step 504 includes accepting a plurality of internal mode, high bandwidth commands. Then, selecting an R1 resistance in Step 506 includes selecting a plurality of R1 resistances in series to the amplifier input in response to the corresponding plurality of internal mode, high bandwidth commands. Selecting an R2 resistance in Step 508 includes selecting a small value of R2 resistance from the amplifier output to the amplifier input. Selecting a C1 capacitance in Step 510 includes selecting a large value C1 capacitance in parallel with the R2 resistance.

A system and method have been described for a cooperating network of resistor and capacitor components with values and switches which permit the same components to be automatically configured into a plurality of bandwidth ranges. External components are added to further extend the bandwidth range and improve the damping factors. A specific example has been provided of an active filter in the context of a PLL circuit. However, the selectable bandwidth range concept of the present invention is applicable to a wider range of uses. Other variations and embodiments will occur to those skilled in the art.

We claim:

1. A phase locked-loop (PLL) active filter integrated circuit with selectable bandwidth ranges comprising:

an amplifier having an amplifier input and an amplifier output; and a filter network having a first port, a second port, a third port, and a fourth port, the first port for accepting an input signal, the second port connected to the amplifier input, the third port coupled to the amplifier output to provide a filtered signal in a selectable range of bandwidths in response to bandwidth range commands received at the fourth port; wherein:

the filter network includes a selectable R1 resistor connected between the first port and the second port, and a selectable parallel R2 resistor/C1 capacitor network connected between the second port and the third port;

the selectable R1 resistor includes:

a first resistor having a plurality of selectable series resistors, an input connected to the first port, and an output;

a second resistor having an input connected to the output of the first resistor, and an output connected to the second port; and a first switch having an input connected to the first port, and an output connected to the output of the first resistor; and the first resistor includes:

a third resistor having an input connected to the input of the first switch, and an output;

a fourth resistor having an input connected to the output of the third resistor, and an output;

a fifth resistor having an input connected to the output of the fourth resistor, and an output;

a sixth resistor having an input connected to the output of the fifth resistor, and an output;

a seventh resistor having an input connected to the output of the sixth resistor, and an output;

an eighth resistor having an input connected to the output of the seventh resistor, and an output;

a ninth resistor having an input connected to the output of the eighth resistor, and an output connected to the input of the second resistor;

a second switch having an input connected to the input of the fourth resistor, and an output connected to the output of the fourth resistor;

a third switch having an input connected to the input of the sixth resistor, and an output connected to the output of the seventh resistor; and a fourth switch having an input connected to the input of the seventh resistor, and an output connected to the output of the eighth resistor.

2. The PLL active filter of claim 1, wherein the selectable parallel R2 resistor/C1 capacitor network includes:

a tenth resistor having an input connected to the second port, and an output;

a multi-pole network of resistors and parallel capacitors connected to the output of the tenth resistor, the multi-pole network having an output;

an eleventh resistor having an input connected to the output of the multi-pole network, and an output connected to the third port;

a second capacitor having an input connected to the second port, and an output connected to the third port; and a fifth switch having an input connected to the output of the tenth resistor, and an output connected to the output of the second capacitor.

3. The PLL active filter of claim 2, wherein the selectable parallel R2 resistor/C1 capacitor network further includes:

a sixth switch having an input connected to the second port, and an output;

a third capacitor having an input connected to the output of the sixth switch, and an output; and a seventh switch having an input connected to the output of the third capacitor, and an output connected to the third port.

4. The PLL active filter of claim 3, wherein the multi-pole network includes:

a twelfth resistor having an input connected to the output of the tenth resistor, and an output;

a thirteenth resistor having an input connected to the output of the twelfth resistor, and an output;

a fourteenth resistor having an input connected to the output of the thirteenth resistor, and an output;

a fifteenth resistor having an input connected to the output of the fourteenth resistor, and an output connected to the input of the eleventh resistor;

a fourth capacitor having an input connected to the input of the thirteenth resistor, and an output connected to the third port; and a fifth capacitor having an input connected to the input of the fifteenth resistor, and an output connected to the third port.

5. The PLL active filter of claim 4, further comprising:

a sixth capacitor having an input connected to the third port, and an output connected to the amplifier output;

an eighth switch having an input connected to the third port, and an output;

a seventh capacitor, external to the integrated circuit, having an input connected to the output of the eighth switch; and a ninth switch having an input connected to the output of the sixth capacitor, and an output connected to the amplifier output.

6. The PLL active filter of claim 5 further comprising:

a sixteenth resistor having an input connected to the amplifier output, and an output; and a tenth switch having an input connected to the amplifier output, and an output connected to the output of the sixteenth resistor.

7. The PLL active filter of claim 6, wherein the filter network accepts an external mode, low bandwidth range command at the fourth port and in response acts to open the first switch, second switch, third switch, and fourth switch, and wherein the filter network acts to close the fifth switch, sixth switch, and seventh switch.

8. The PLL active filter of claim 7, wherein the eighth and ninth switches are closed in response to the external mode, low bandwidth range command.

9. The PLL active filter of claim 8, further comprising a seventeenth resistor, external to the integrated circuit, having an input connected to the output of the sixteenth resistor, and an output connected to ground, wherein the tenth switch is opened in response to the external mode, low bandwidth range command.

10. The PLL active filter of claim 6, wherein the filter network accepts an external mode, high bandwidth range command at the fourth port and in response acts to close the first switch, and wherein the filter network acts to open the fifth switch, sixth switch, and seventh switch.

11. The PLL active filter of claim 10, wherein the eighth and ninth switches are closed in response to the external mode, high bandwidth command.

12. The PLL active filter of claim 11, further comprising a seventeenth resistor, external to the integrated circuit, having an input connected to the output of the sixteenth resistor, and an output connected to ground, wherein the tenth switch is opened in response to the external mode, high bandwidth range command.

13. The PLL active filter of claim 6, wherein:

the filter network accepts a plurality of internal mode, high bandwidth range commands at the fourth port, and in response acts to open the first switch;

the filter network selectively closes the second switch, third switch, and fourth switch in response to corresponding commands from the plurality of internal mode, high bandwidth range commands; and the filter network acts to close the fifth switch, sixth switch, seventh switch, and tenth switch.

* * * * *